(12) United States Patent  
Fiorentino et al.

(10) Patent No.: US 8,810,074 B2  
(45) Date of Patent: Aug. 19, 2014

(54) MULTI-WAY ELECTRICAL SWITCH

(75) Inventors: Marco Fiorentino, Mountain View, CA (US); Wei Wu, Palo Alto, CA (US); John Paul Strachan, Stanford, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 741 days.

(21) Appl. No.: 13/130,797

(22) PCT Filed: Jan. 30, 2009

(86) PCT No.: PCT/US2009/000621  
§ 371 (c)(1),  
(2), (4) Date: May 24, 2011

(87) PCT Pub. No.: WO2010/087798  
PCT Pub. Date: Aug. 5, 2010

(65) Prior Publication Data  
US 2011/0234296 A1 Sep. 29, 2011

(51) Int. Cl.  
*H01H 47/00* (2006.01)

(52) U.S. Cl.  
USPC .......................................................... 307/125

(58) Field of Classification Search  
USPC ......................................................... 307/125  
See application file for complete search history.

(56) References Cited

U.S. PATENT DOCUMENTS

2005/0162244 A1* 7/2005 Naito et al. ..................... 335/78

* cited by examiner

*Primary Examiner* — Robert L. Deberadinis

(57) ABSTRACT

Embodiments of the present invention include a family of multi-way switches that can be configured to output an input signal to any combination of n output signal lines. Certain embodiments of the present invention employ a memristive junction between the input signal and each output signal line, the state of which is configured by one or more control signal lines. The memristive junction between the input signal line and each output signal can be switched between a stable, low-conductance state and a high-conductance state. A wide variety of different types of multi-way switches may be fabricated according to various embodiments of the present invention.

15 Claims, 25 Drawing Sheets

Figure 3B

|   | O1c | O2c | O3c | O4c | O5c |     | Onc |
|---|-----|-----|-----|-----|-----|-----|-----|
| i | 0   | 0   | 0   | 0   | 0   |     | 0   |
| O1| 0   | 0   | 0   | 0   | 0   |     | 0   |
| O2| 0   | 0   | 0   | 0   | 0   |     | 0   |
| O3| 0   | 0   | 1   | 0   | 0   |     | 0   |
| O4| 0   | 0   | 0   | 0   | 0   |     | 0   |
|   | 0   | 0   | 1   | 0   | 0   |     | 0   |
| On|     |     |     |     |     |     |     |

| i | O1c | O2c | O3c | O4c | O5c | | Onc |
|---|-----|-----|-----|-----|-----|---|-----|
| 0 | 0 | 0 | 0 | 0 | 0 | | 0 |
| O1 | 0 | 0 | 0 | 0 | 0 | | 0 |
| O2 | 0 | 0 | 0 | 0 | 0 | | 0 |
| O3 | 0 | 0 | 0 | 0 | 0 | | 0 |
| O4 | 0 | 0 | 1 | 0 | 0 | | 0 |
| | 0 | 0 | 0 | 0 | 0 | | 0 |
| On | 0 | 0 | 0 | 0 | 0 | | 0 |

307, 330

|   | O1c | O2c | O3c | O4c | O5c |
|---|---|---|---|---|---|
| i | 0 | 1 | 0 | 0 | 0 |
|   | 0 | 1 | 0 | 0 | 0 |
|   | 0 | 0 | 0 | 0 | 0 |
|   | 0 | 0 | 1 | 0 | 0 |
|   | 0 | 0 | 0 | 0 | 0 |

|   |
|---|
| O1 |
| O2 |
| O3 |
| O4 |

| Onc |
|---|
| 1 |
| 0 |
| 0 |
| 0 |
| 0 |

| | |
|---|---|
| 0 | 0 |
| 0 | 0 |
| 0 | 0 |
| 0 | 0 |
| 0 | 0 |

| On |
|---|

| |
|---|
| 1 |

Figure 3E

|   | O1c | O2c | O3c | O4c | O5c |   | Onc |
|---|---|---|---|---|---|---|---|
| i | 0 | 0 | 0 | 0 | 0 |   | -1 ⟵ 310 |
| O1 | 0 | 1 | 0 | 0 | 0 |   | 0 |
| O2 | 0 | 0 | 0 | 0 | 0 |   | 0 |
| O3 | 0 | 0 | 1 | 0 | 0 |   | 0 |
| O4 | 0 | 0 | 0 | 0 | 0 |   | 0 |

| On | 0 | 0 | 0 | 0 | 0 | 0 ⟵ 334 |
|---|---|---|---|---|---|---|

Figure 3F

| i | O1c | O2c | O3c | O4c | O5c | | Onc |
|---|---|---|---|---|---|---|---|
| 1 ←304 | 0 | 0 | 0 | 0 | 0 | | 0 |
| 1 ←314 | 1 | 0 | 0 | 0 | 0 | | 0 |
| 0 | 0 | 0 | 0 | 0 | 0 | | 0 |
| 1 ←316 | 0 | 0 | 1 | 0 | 0 | | 0 |
| 0 | 0 | 0 | 0 | 0 | 0 | | 0 |
| | O1 | O2 | O3 | O4 | | | |

| On |
|---|
| 0 | 0 | 0 | 0 | 0 |

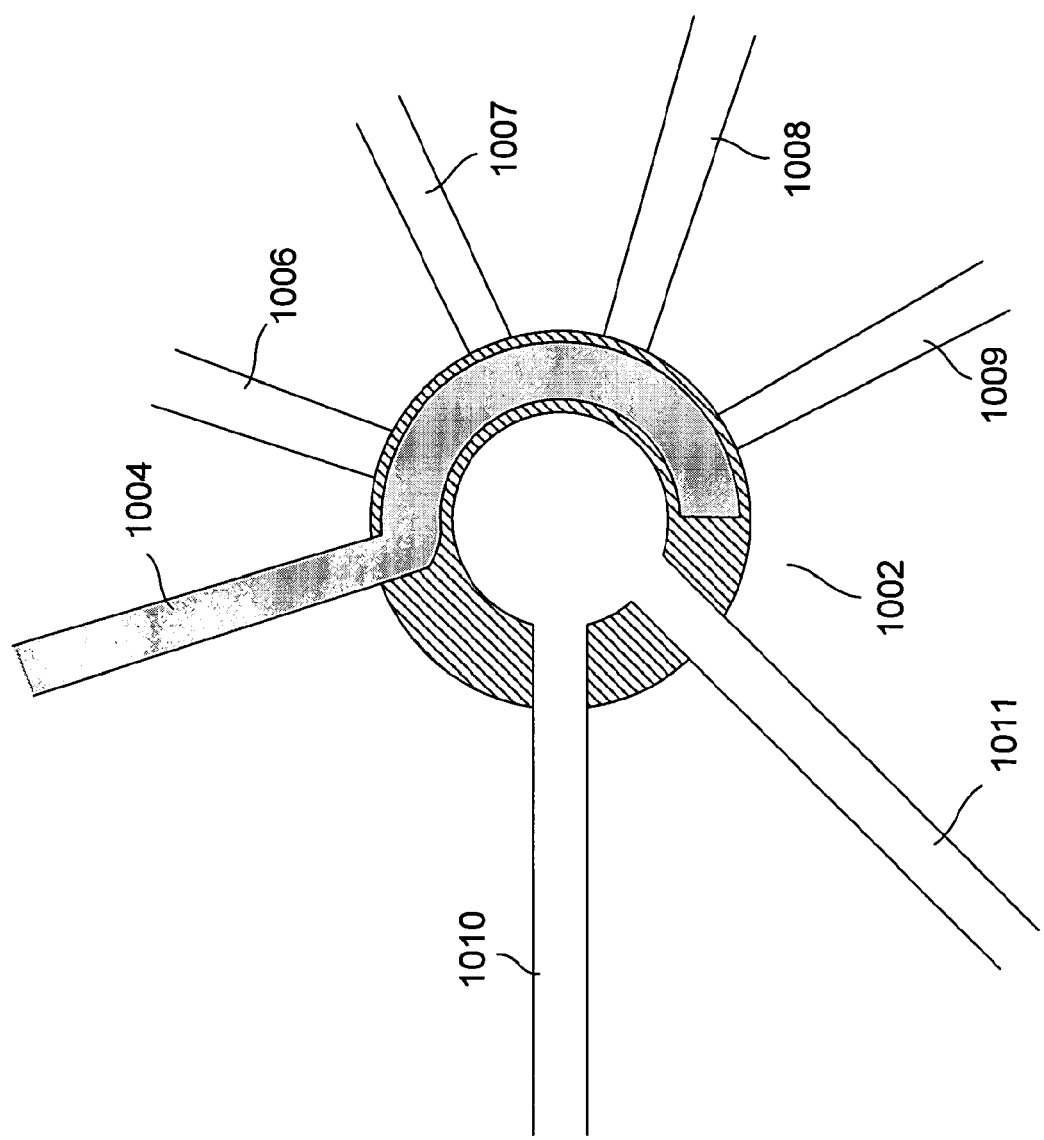

US 8,810,074 B2

MULTI-WAY ELECTRICAL SWITCH

TECHNICAL FIELD

The present invention is related to electrical switches and, in particular, to a family of multi-way switches that can be configured to output a signal to any combination of output signal lines.

BACKGROUND OF THE INVENTION

The dimensions of transistors, signal lines, and other components of integrated circuits have steadily decreased, due to improvements in materials and manufacturing processes, from macroscopic dimensions to current, state-of-the-art submicroscale dimensions. The relentless decrease in the sizes of transistors, signal lines, and other integrated-circuit components has lead to increasingly fast and capable processors, microcontrollers, and other types of integrated circuits. However, current photolithography-based manufacture methods may soon approach fundamental physical limits that may slow and then altogether halting further progress in decreasing integrated-circuit component sizes. As a result, research and development efforts have increasingly turned to non-photolithography-based nanoscale electronics. A variety of different approaches have been developed for manufacturing nanoscale components that can be directed to assemble, or that self-assemble, into regular structures with useful physical and electronic properties. Examples include various types of nanowire crossbars. Nanowire crossbars include two layers of parallel nanowires oriented approximately orthogonally to one another in order to produce a grid or lattice, at the crosspoints of which passive and active electronic components may be configured. As research has progressed in this field, many interesting and unexpected properties of nanoscale electronic components have been discovered, including memristive materials that feature two or more stable conductivity states. Researchers and developers of non-photolithography-based nanoscale electronics, manufacturers and designers of devices and device subcomponents that are fabricated from, or that include, macroelectronic components and subcomponents, and others continue to discover new characteristics and properties of nanoscale materials and employ these characteristics and properties in a variety of new and useful circuit elements, logic components, and other functional structures that can be used to design and fabricate electronic subcomponents and devices.

BRIEF DESCRIPTION OF THE DRAWINGS

FIGS. 3A-G illustrate operation of the n-way switch shown in FIG. 2.

FIG. 9 provides a matrix representation of operation of the multi-way switch shown in FIG. 8.

FIG. 10 shows a two-input, four-output multi-way switch that represents an embodiment of the present invention.

DETAILED DESCRIPTION OF THE INVENTION

Embodiments of the present invention include a family of multi-way switches that can be configured to output an input signal to any combination of n output signal lines. Certain embodiments of the present invention employ a memristive junction between the input signal and each output signal line, the state of which is configured by one or more control signal lines. The memristive junction between the input signal line and each output signal can be switched between a stable, low-conductance state and a high-conductance state. A wide variety of different types of multi-way switches may be fabricated according to various embodiments of the present invention.

FIGS. 1A-E illustrate a multi-way switch. FIGS. 1A-E all use the same illustration conventions, which are described with reference to FIG. 1A, below. FIGS. 1A-E illustrate a macroscale multi-way switch, as an analogy to the nanoscale multi-ways switches that represent embodiments of the present invention. The switch 102 includes an input line 104 and three output lines 106-108. The input signal received through input signal line 104 can be distributed to any combination of the three output signal lines, or may be distributed to none of the output signal lines, depending on the state of three radio-button-like output-signal-line control features 110-112.

Figure 1A:
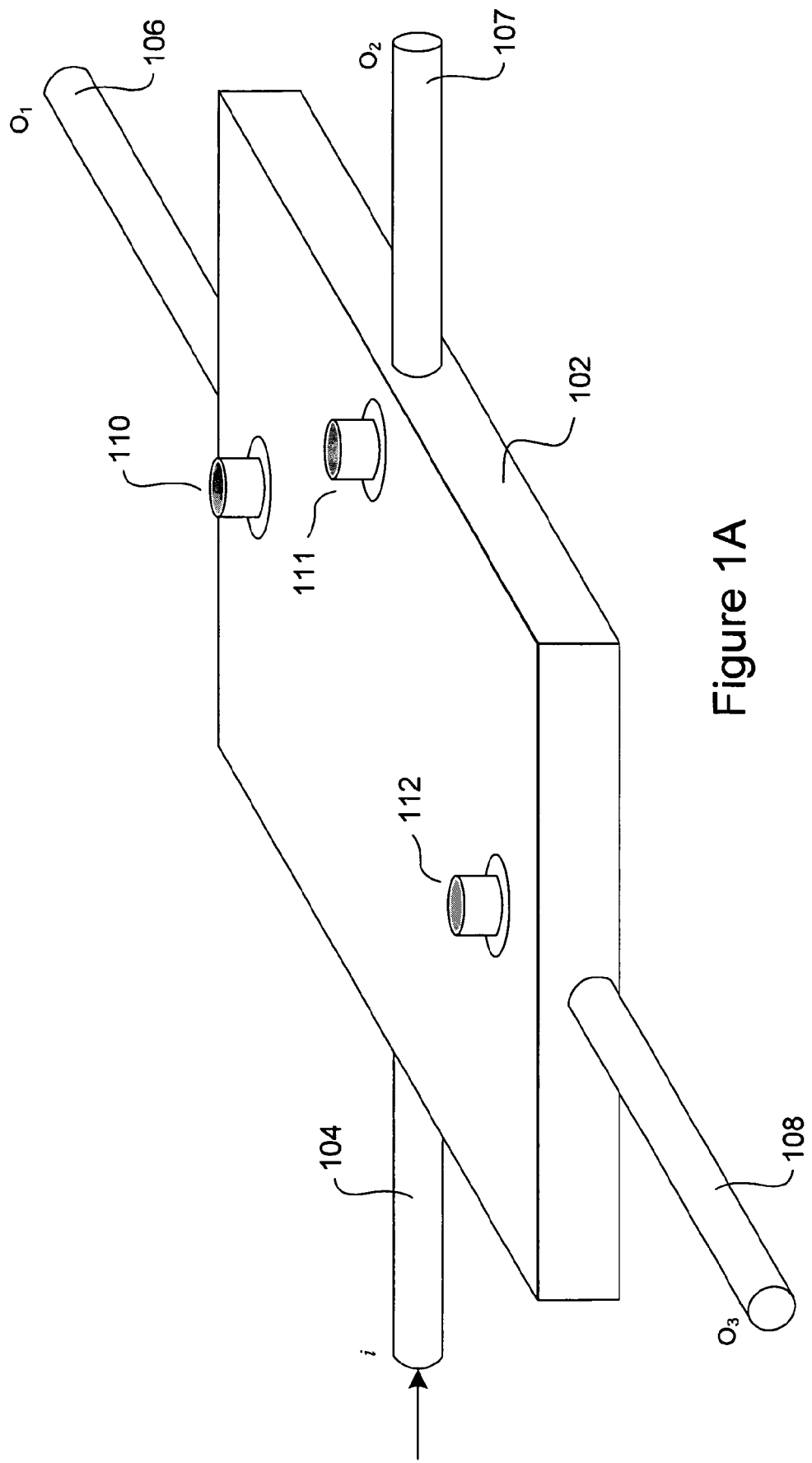
FIGS. 1A-E illustrate a multi-way switch.
Figure 1B:
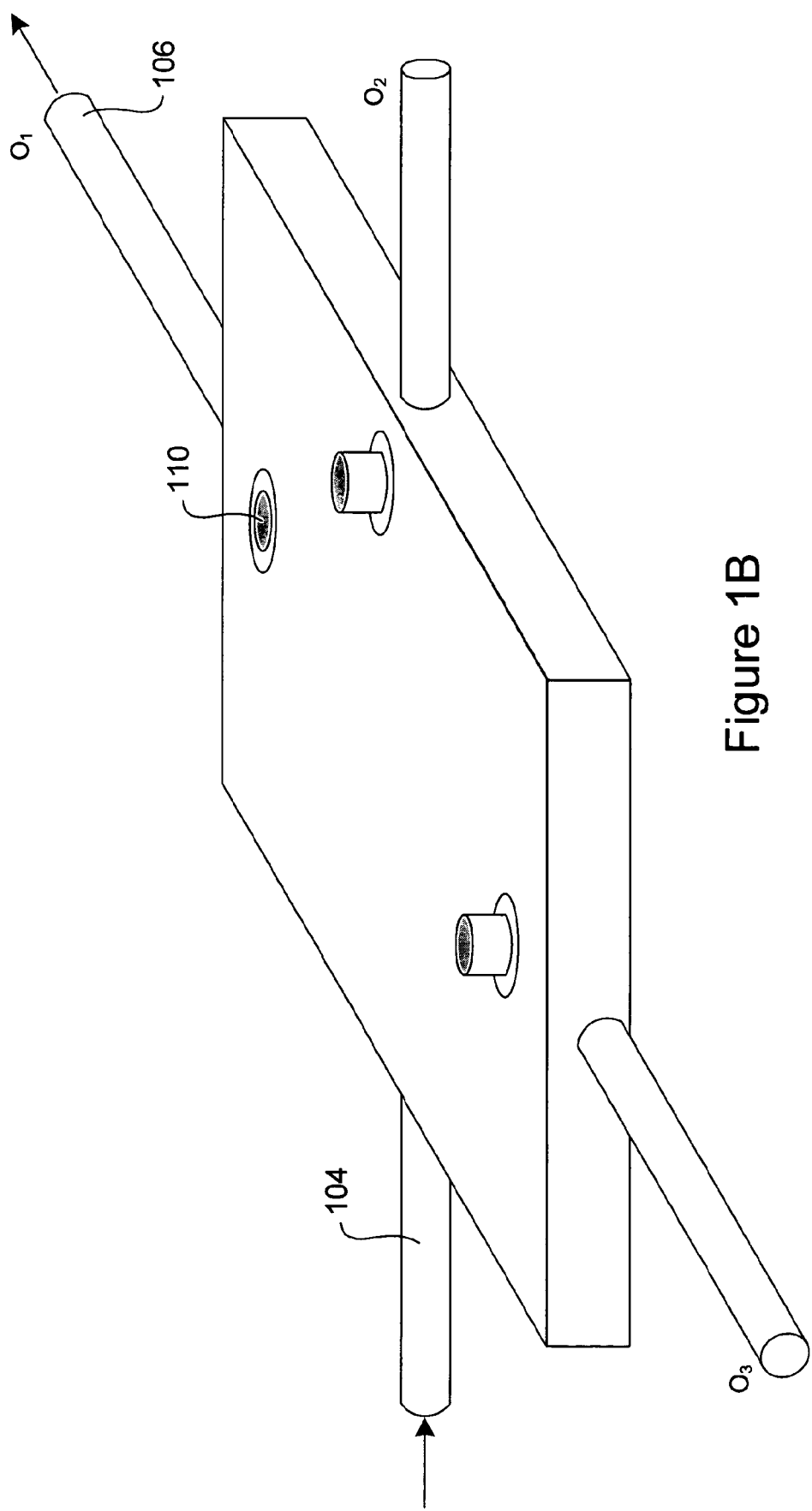
Figure 1C:
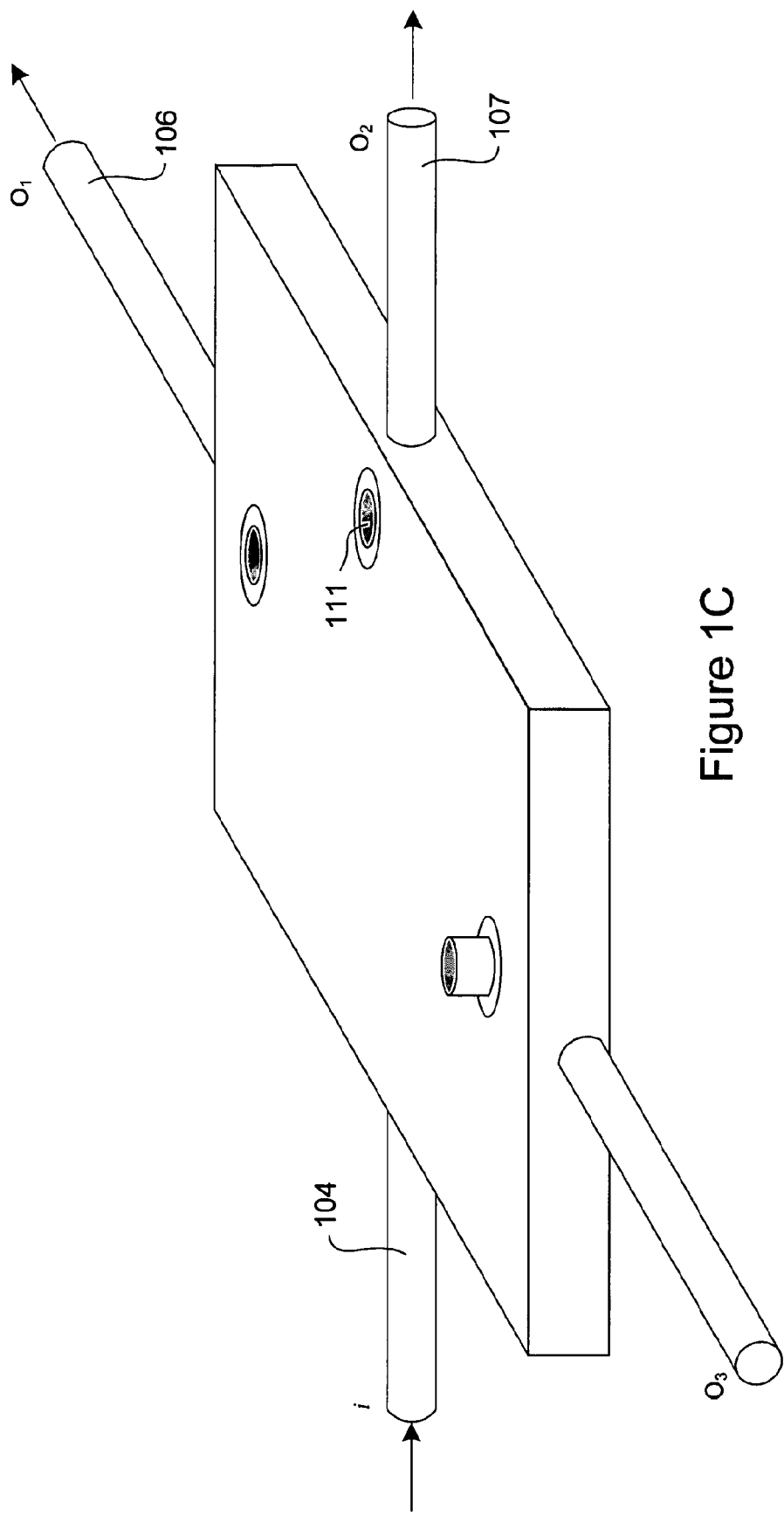
Figure 1D:
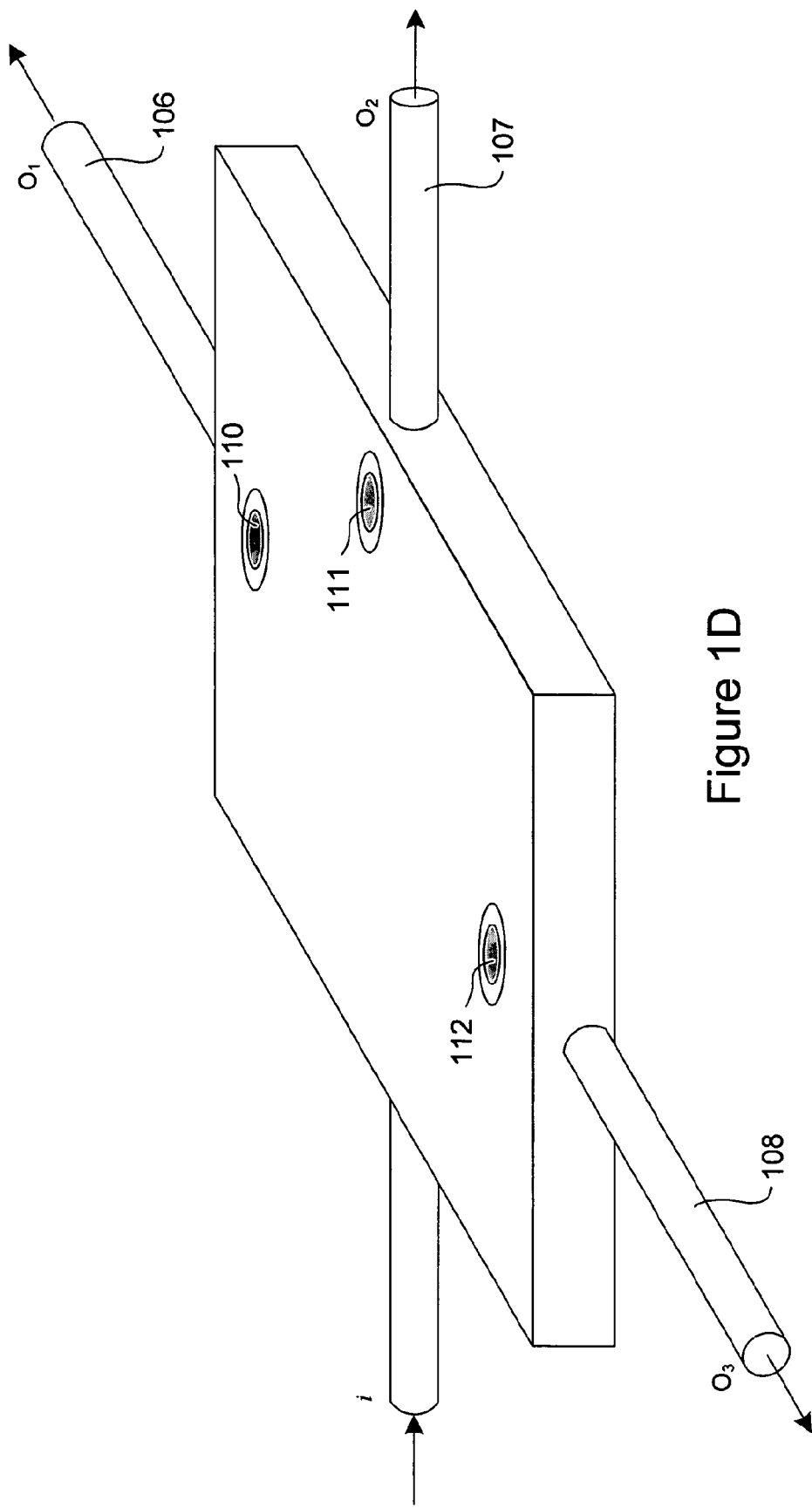
Figure 1E:
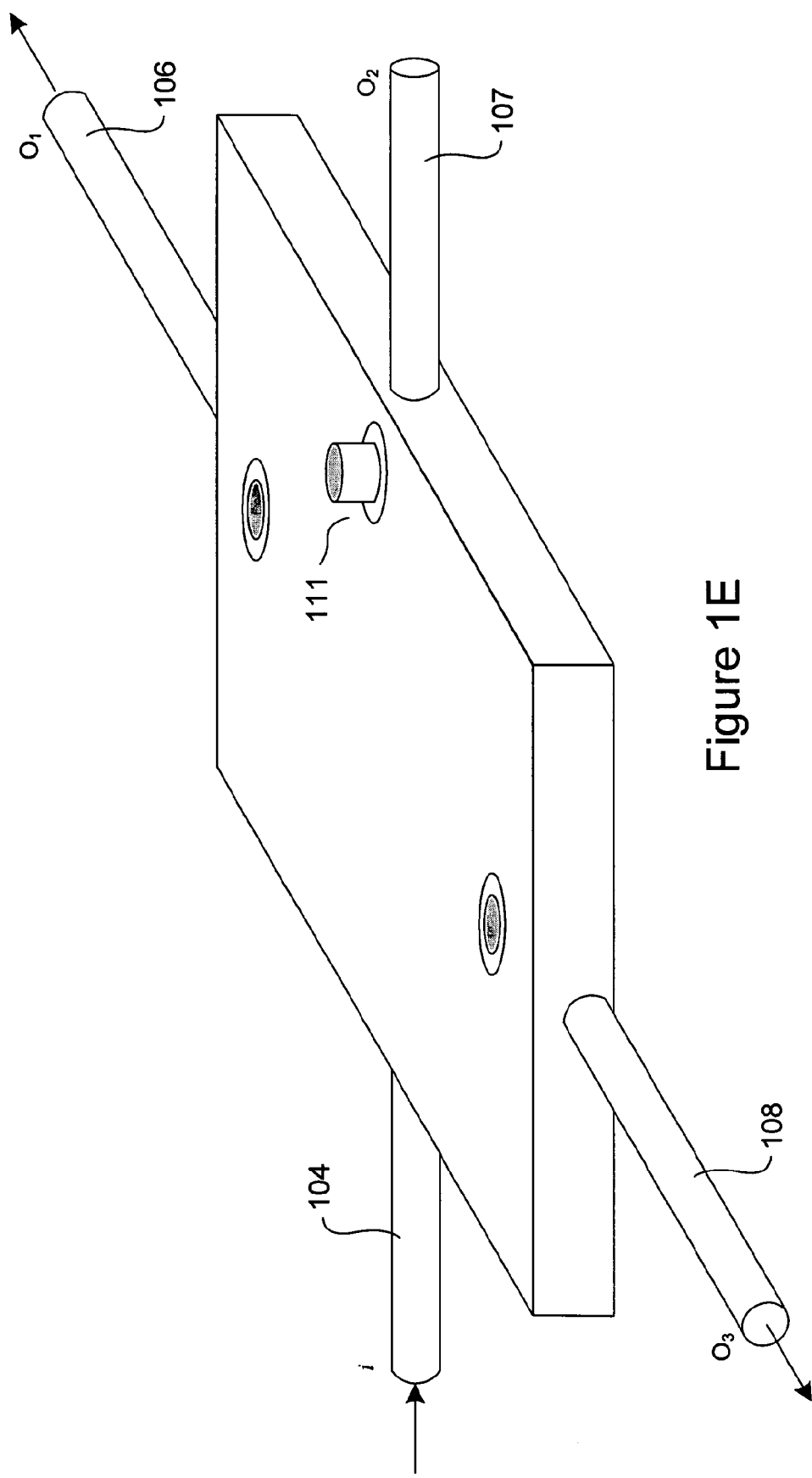

In an initial state, shown in FIG. 1A, all of the radio-button-like control features 110-112 are in the OFF position and no signal is directed to any of the three output signal lines 106-108, despite input of signal to the input signal line 104. In FIG. 1B, radio-button-like control feature 110 has been depressed to place the control feature into an ON state, as a result of which a signal is output to output signal line 106. Output signal line 106 is conductively coupled, or interconnected, to input signal line 104 as a result of the control feature having been depressed and placed into an ON state. This conductive coupling persists until control feature 110 is manually reset to an OFF state. As shown in FIG. 1C, subsequent depression of control feature 111 conductively couples output signal line 107 to the input signal line 104, as a result of which input signals are output both to output signal line 106 and to output signal line 107. As shown in FIG. 1D, when all three control features 110-112 are placed into the ON state, all three output signal lines 106-108 are conductively coupled with the input signal line. A manual reset of control feature 111, as shown in FIG. 1E, decouples, or electrically isolates, output signal line 107 from input signal line 104, as a result of which input signals are output only to output signal lines 106 and 108.

Figure 2:
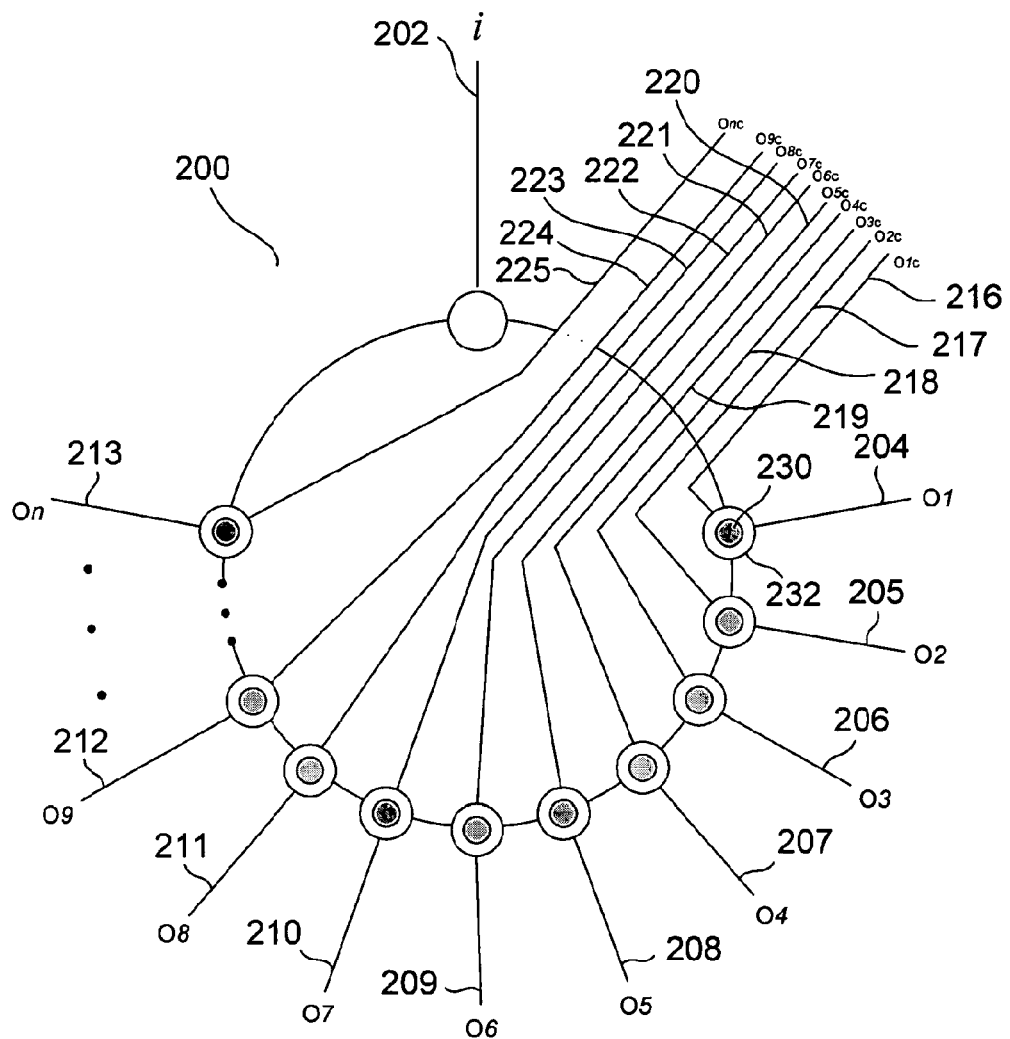
FIG. 2 provides a schematic drawing of an n-way switch that describes a family of embodiments of the present invention.

FIG. 2 provides a schematic drawing of an n-way switch that describes a family of embodiments of the present invention. The n-way switch 200 allows an input signal line 202 to be conductively coupled to any combination of n output signal lines 204-213. The conductive coupling of the input signal line 202 to any particular output signal line, such as output signal line O1 (204 in FIG. 2), is controlled by a separate control line, such as control line O1e (216 in FIG. 2) that controls coupling and decoupling of output signal line O1 to the input signal line. In FIG. 2, each control line of the set of control lines O1c, O2c, . . . , Onc 216-225 each controls coupling of a different output signal line of the set of output signal lines O1, O2, . . . , On (204-213 in FIG. 2) to the input signal line 202. Conceptually, each control line 216-225 controls a sub-switch that can couple or decouple an output signal line from the input signal line. In FIG. 2, the sub-switches are represented by filled disks, such as filled disk 230, within unfilled disks, such as unfilled disk 232. Again, referring back to FIGS. 1A-E, the state of each sub-switch is stable, so that a control signal need be applied to a particular sub-switch only as long as necessary to change the state of the sub-switch. The sub-switches have, in other words, persistent states, unlike a transistor, for which voltage needs to be applied to the gate in order to maintain a conductive coupling of the source and drain nodes of the transistor.

FIGS. 3A-G illustrate operation of the n-way switch shown in FIG. 2. FIGS. 3A-G all use the same illustration conventions, described with reference to FIG. 3A, below. Operation of the n-way switch is described by a series of matrices. Each matrix represents a state of the multi-way switch, and a transformation of one matrix to another represents a state transition. Each matrix contains a first row 302 that describes the state of the input signal line 304 and the states of the n control lines 305-310. Each matrix includes a first column 312 that includes the states of each output signal line 314-318. The input row 302 and output column 312 form the upper and left-hand boundaries of an n×n sub-matrix 320, each cell of which is indexed by pair of coordinates (x,y). The x coordinate of the pair of coordinates (x,y) corresponds to an output signal line and the y coordinate of the pair of coordinates (x,y) corresponds to a control line. Each cell (x,y) of the n×n sub-matrix describes the state of the sub-switch, controlled by control line y, that couples and decouples output signal line x from the input signal line. For the switch shown in FIG. 2, a single control line controls coupling of a single, corresponding output signal line to the input signal line, and thus the two-dimensional matrix 320 is essentially a diagonal matrix. In this case, there are no sub-switches corresponding to the off-diagonal cells. However, in various alternative embodiments of the present invention, a control line may control the states of two or more sub-switches and the state of a sub-switch may be controlled by multiple control lines, in which case the off-diagonal elements of the n×n matrix 320 may correspond to sub-switch states.

Figure 3A:
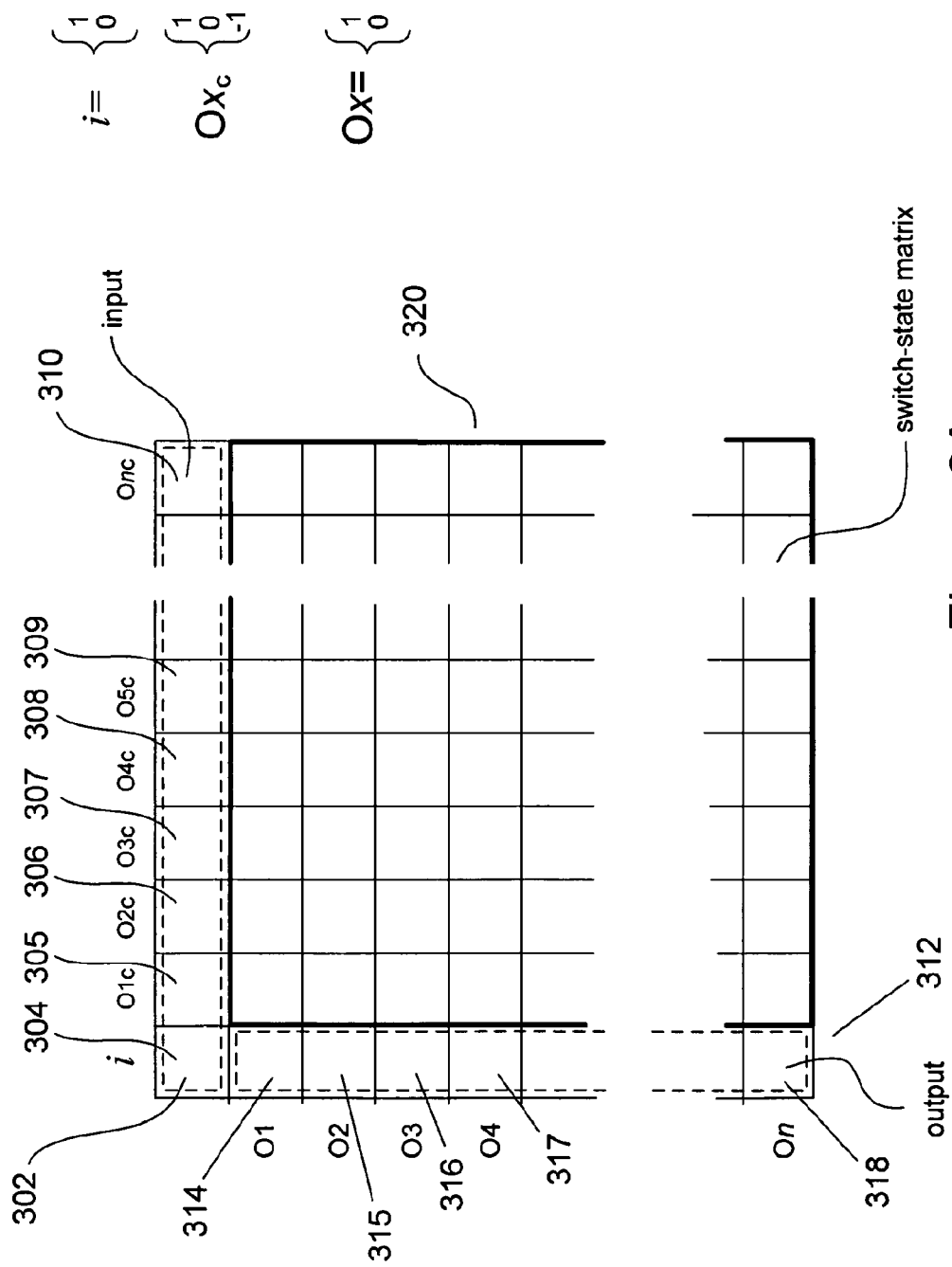

Cells 304 and 314-318, in the first column of the matrix shown in FIG. 3A, may contain either of two values: "1," corresponding to the presence of a voltage or current signal; and "0," corresponding to the absence of a voltage or current signal. Multi-way switches of the present invention may provide for switching of either digital or analog signals. However, for the purposes of describing the states of the multi-way switch, the value "1" in a cell of the first column indicates the presence of signal, and the value of "0" indicates the absence of signal, with the understanding that, in analog embodiments, the signal may vary over a range of voltages or currents. Cells 305-310 of the first row 302 of the matrix may contain any three different values: "1." indicating application of a positive control voltage; "0," indicating no applied voltage; and "−1," indicating a negative control voltage. The cells of the n×n sub-matrix 320 can contain either of the two values "1" and "0." The value "1" indicates that, for cell (x,y), the x output line is conductively coupled to the input line as a result of a positive control voltage currently or previously applied to control line y, and the value "0" indicates that the x output line is decoupled from the input line as a result of no positive control voltage yet applied to control line y (assuming that the initial state of a sub-switch is OFF) or as a result of a negative control voltage applied to control line y. Thus, the binary values in the n×n submatrix 320 indicates the states of sub-switches.

Figure 3B:
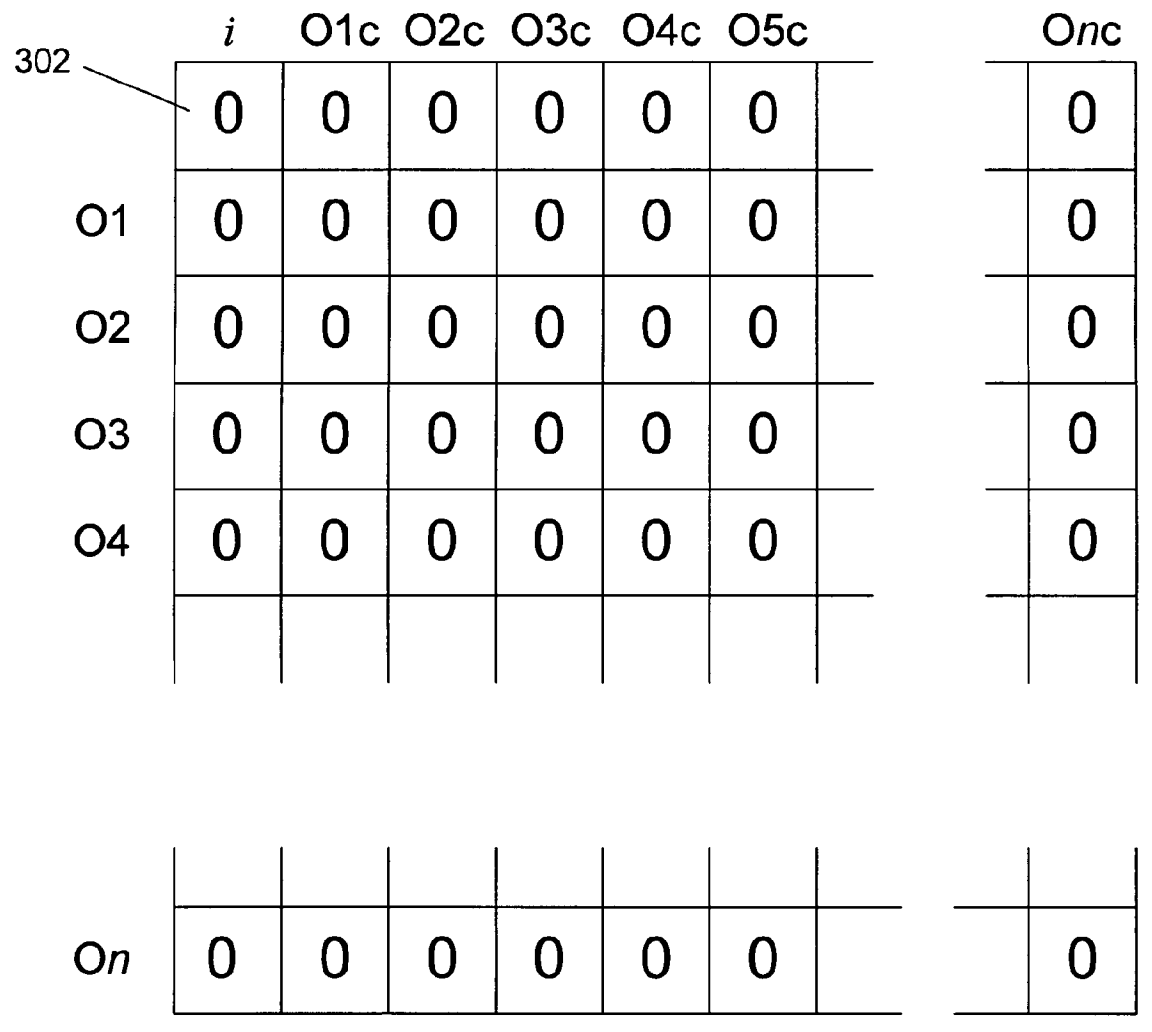

Initially, as shown in FIG. 3B, the states of all sub-switches may be "0," or OFF, the input signal fine may carry no current or voltage signal, as indicated by the value "0" in cell 302, the output signal lines may carry no current or voltage signal, and no voltage may be applied to the control lines I. In FIG. 3C, control signal line O3c is raised to the control positive voltage, as indicated by the value "1" in cell 307. This results in a change of the state of the sub-switch, which couples output signal line O3 to the input signal line, to "1" (330 in FIG. 3C), or ON. As shown in FIG. 3D, this ON state 330 persists even after the control positive voltage is no longer applied to control line O3c, as indicated by the value "0" in cell 307. Similarly, as shown in FIGS. 3E-F, application of a positive control voltage to control lines O1c and Onc, as represented by the values "1" in cells 305 and 310 in FIG. 3E, result in changing the states of the sub-switches described by cells 332 and 334 to ON, as represented by the values "1" in cells 332 and 334. As shown in FIG. 3F, application of a negative control voltage to control line Onc, as represented by the value "−1" in cell 310 in FIG. 3F, changes the state of the sub-switch represented by 334 back to OFF, as represented by the value "0" in cell 334 in FIG. 3F. Finally, as shown in FIG. 3G, input of signal to the input signal line, as represented by the value "1" in cell 304 in Figure G, results in output of signal to output signal lines O1 and O3, as represented by the values "1" in cells 314 and 316 in FIG. 3O. If any cell of the sub-matrix (a,y) has value "1," then output signal line a is currently conductively coupled to the input signal line.

Multi-way switches may be designed, according to various alternative embodiments of the present invention, to implement a variety of different operational characteristics as described by various different state transitions, such as those shown in FIGS. 3B-3G. As mentioned above, for the multi-way switch shown in FIG. 2, only diagonal elements of the n×n submatrix 320 can contain non-zero values, since each control line separately controls a single output signal line different from the output signal lines controlled by other control lines. In an exemplary alternative embodiment, a single control line may control coupling of all of the n output signal lines to the input signal line. In this case, the matrix would have only two columns and n rows, and application of positive control voltage to the single control line would result in coupling all n output signal lines to the input signal line.

Figure 4A:
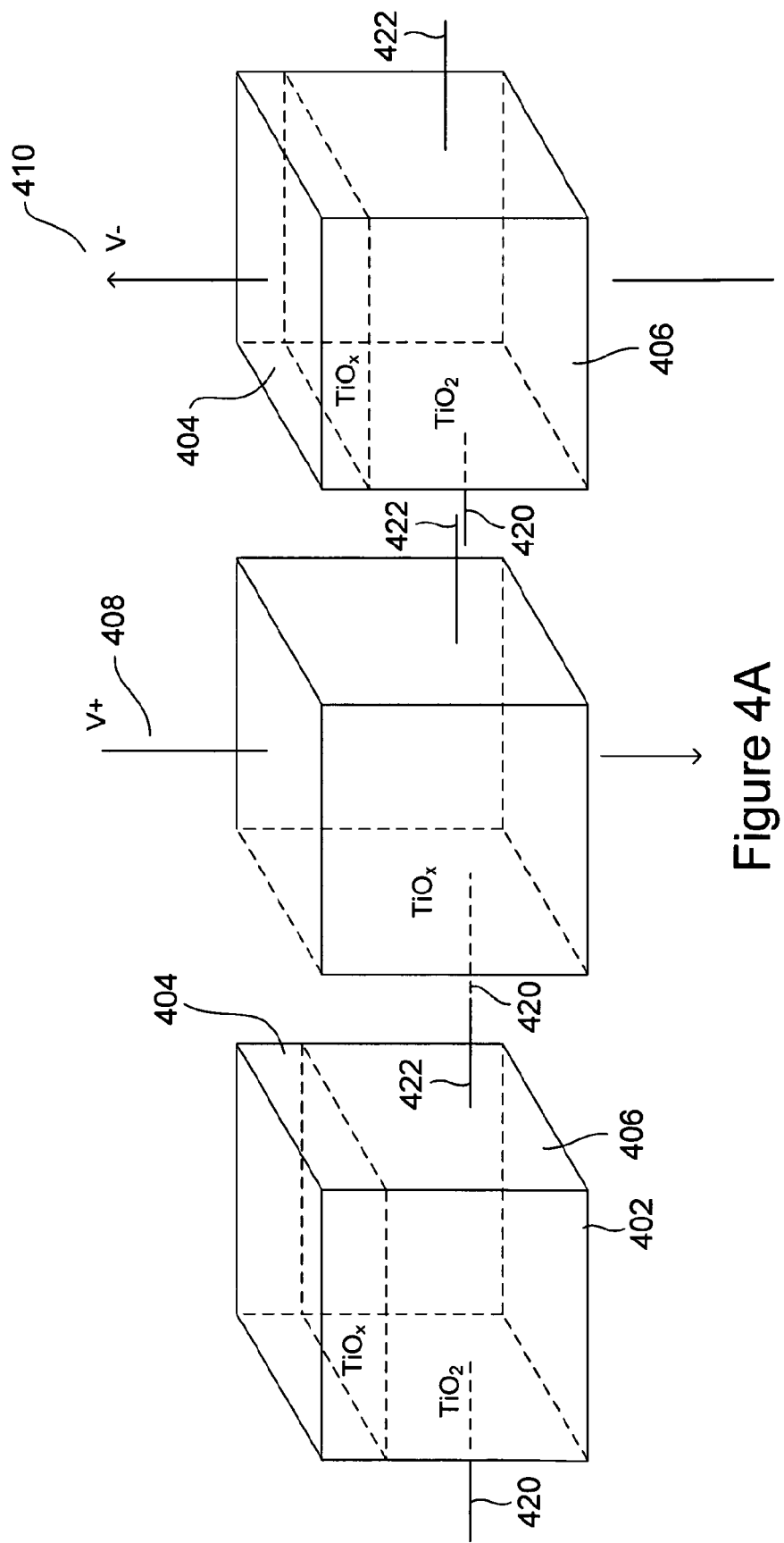
FIGS. 4A-B illustrate characteristics of a memristive substance.
Figure 4B:
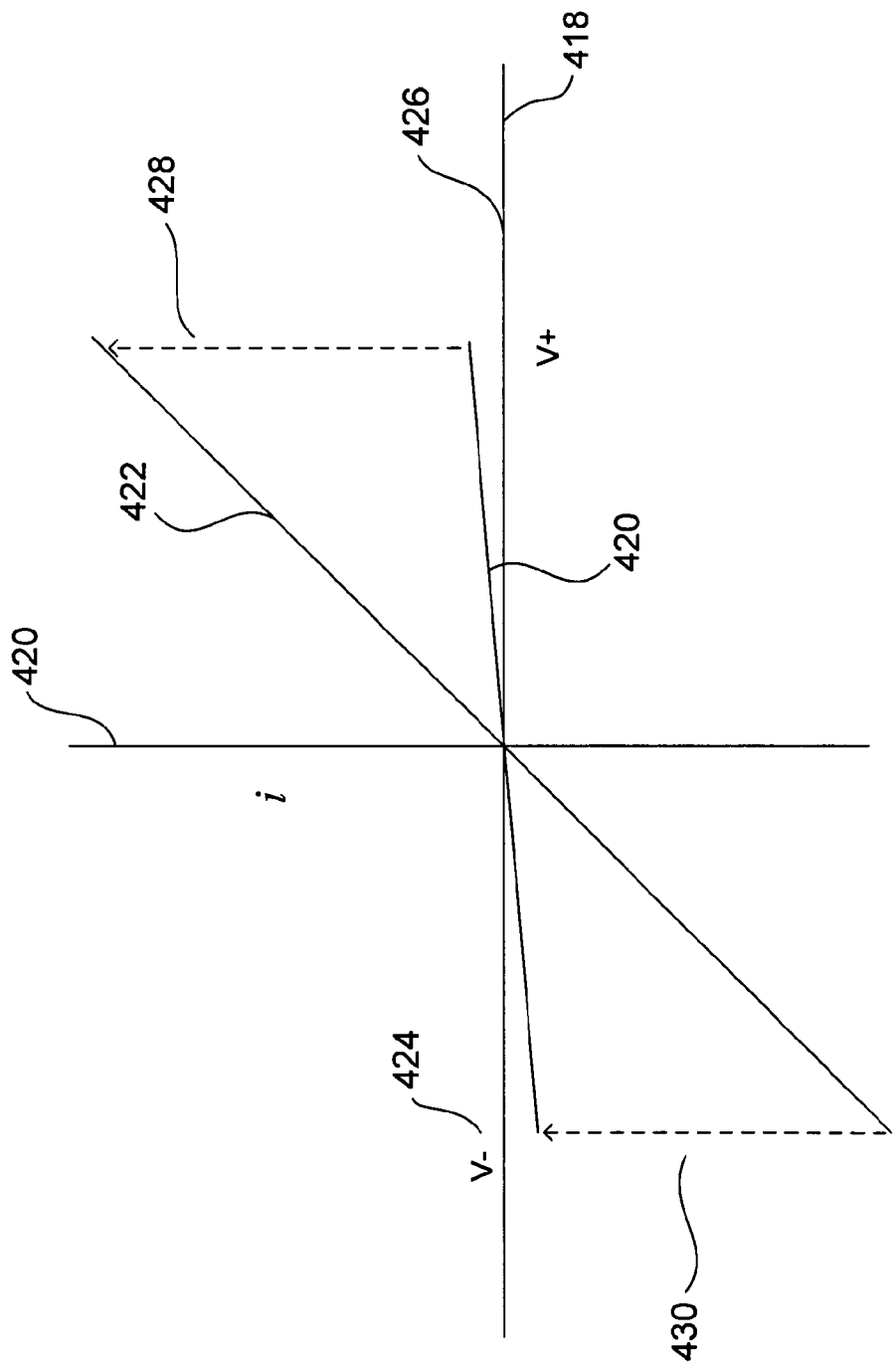

FIGS. 4A-B illustrate characteristics of a memristive substance. In the example shown in FIGS. 4A-B, the memristive substance is a layer of oxygen-depleted titanium dioxide, symbolically referred to as "$TiO_x$," above a layer of titanium dioxide $TiO_2$. In FIG. 4A, a first volume element 402 of the memristive substance includes a layer of oxygen-depleted $TiO_x$ 404 above a thicker layer of titanium dioxide $TiO_2$ 406. The $TiO_x$ layer 404 contains oxygen-atom vacancies, equivalent to holes in a semiconductor, and is therefore conductive. The $TiO_2$ layer 406 is an insulator. Application of a positive voltage 408 across the volume element redistributes the oxygen vacancies throughout the volume element, so that the volume element becomes conductive. The redistribution of oxygen vacancies is persistent, even after the positive voltage is no longer applied. Application of a negative voltage 410 again redistributes the oxygen vacancies and reconstitutes a depleted-oxygen $TiO_x$ layer 404 above a $TiO_2$ layer 406.

When input 420 and output 422 signal lines are connected to the bottom portions of the volume element, perpendicular to the direction of the applied voltages, as shown in FIG. 4A, the input signal line 420 would be conductively coupled to the output signal line 422 when the $TiO_x$ is distributed throughout the volume element, following application of a positive control voltage, and would be decoupled from the output signal lines when the $TiO_x$ is layered above $TiO_2$.

FIG. 4B illustrates a typical double-hysteresis current v voltage graph for a memristive substance, such as $TiO_x$ shown in FIG. 4A. In FIG. 4B, voltage is plotted with respect to the horizontal axis 418 and current is plotted with respect to the vertical axis 420. A memristive substance has a low-conductivity state, described by a line segment 420 of relatively modest slope, and a high-conductivity state described by a line segment 422 with a relatively large slope. In the low-conductivity state, the current passed through the substance remains relatively low despite the magnitude of applied voltage, within a range of voltages between $V_-$ 424 and $V_+$ 426. However, when a positive control voltage $V_+$ is applied, the memristive substance transitions from the low-conductivity state to the high-conductivity state, as shown by dashed arrow 428 in FIG. 4B. As the voltage is lowered, the current correspondingly decreases, in the high-conductivity state. When a negative-control voltage of magnitude $V_-$ 424 is applied to the memristive substance in the high-conductivity state, the memristive substance transitions to the low-conductivity state, as represented by dashed arrow 430 in FIG. 4B.

$TiO_x$ is but one example of a number of different possible memristive substances. Other memrisitive substances include zirconia, $ZrO_2$ and hafnia $HfO_2$, as well as titanates, zirconates, and hafnates. Titanates, for example, include $ATiO_3$, where A represents one of the divalent elements Sr, Ba, Ca, Mg, Zn, and Cd. There are also a large variety of other oxides of the transition metals and rare-earth metals with different valences that may exhibit memristive characteristics, both individually and as more complex compounds. In addition, various nitrides, having at least one nitrogen atom and at least one other element, may exhibit memristive characteristics, including $Si_3N_4$, $Bc_3N_2$, $P_3N_5$, TiN, $Li_3N$, and a large variety of other nitrides. Alternatively, sulfides, having at least one sulfur atom and at least one other element, may exhibit memristive characteristics, including CdS, PbS, ZnS, $CS_2$, and a large variety of other sulfides. Alternatively, carbides, having at least one carbon atom and at least one other element, may exhibit memristive characteristics, including $Na_2C_2$, $CaC_2$, $LaC_2$, $Mg_2C_3$, $B_4C$, SiC, and a large variety of other carbides.

Figure 5A:
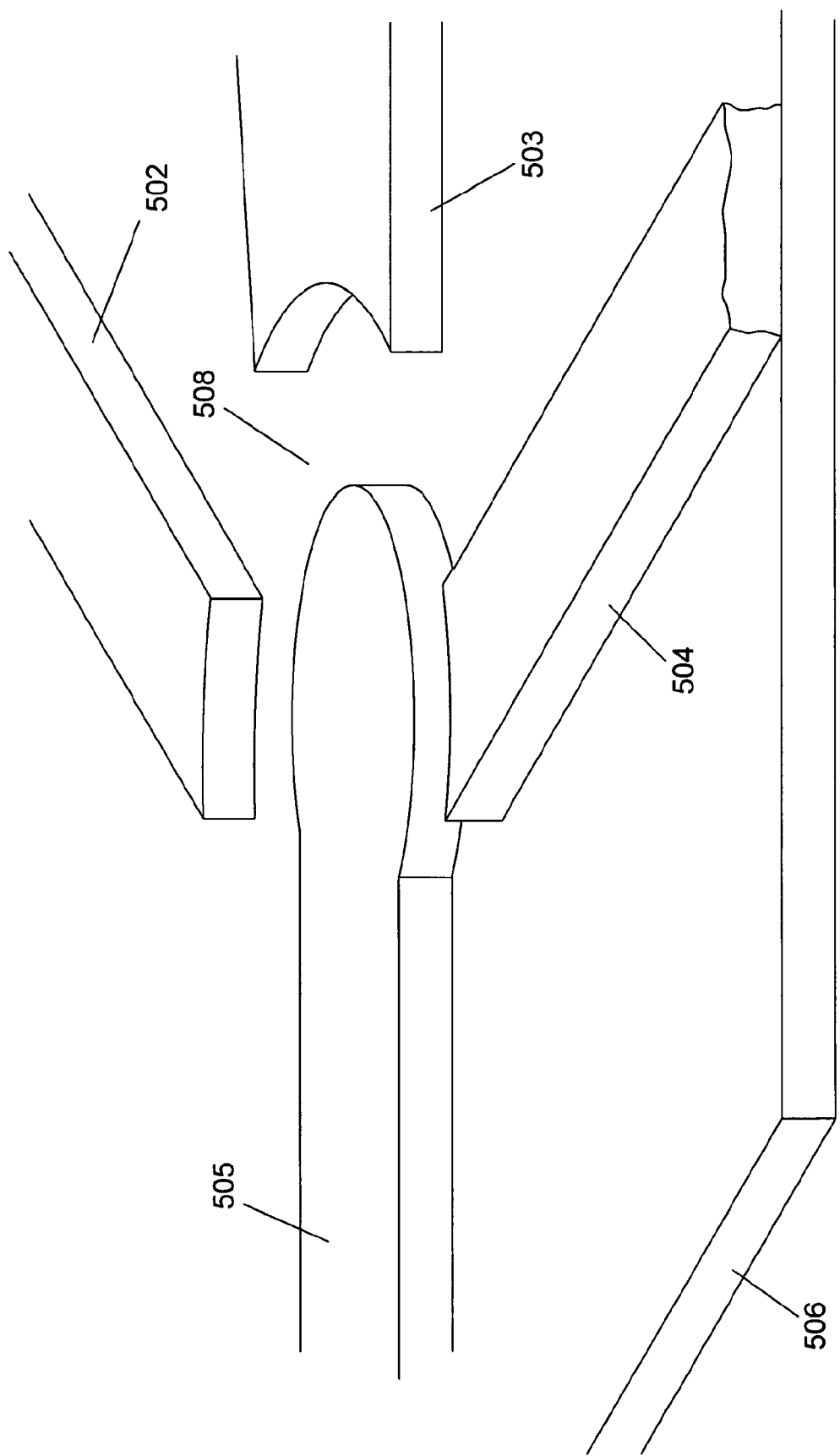
FIGS. 5A-D illustrate sequential fabrication of a multi-way, persistent, nanoscale switch according to one embodiment of the present invention.
Figure 5B:
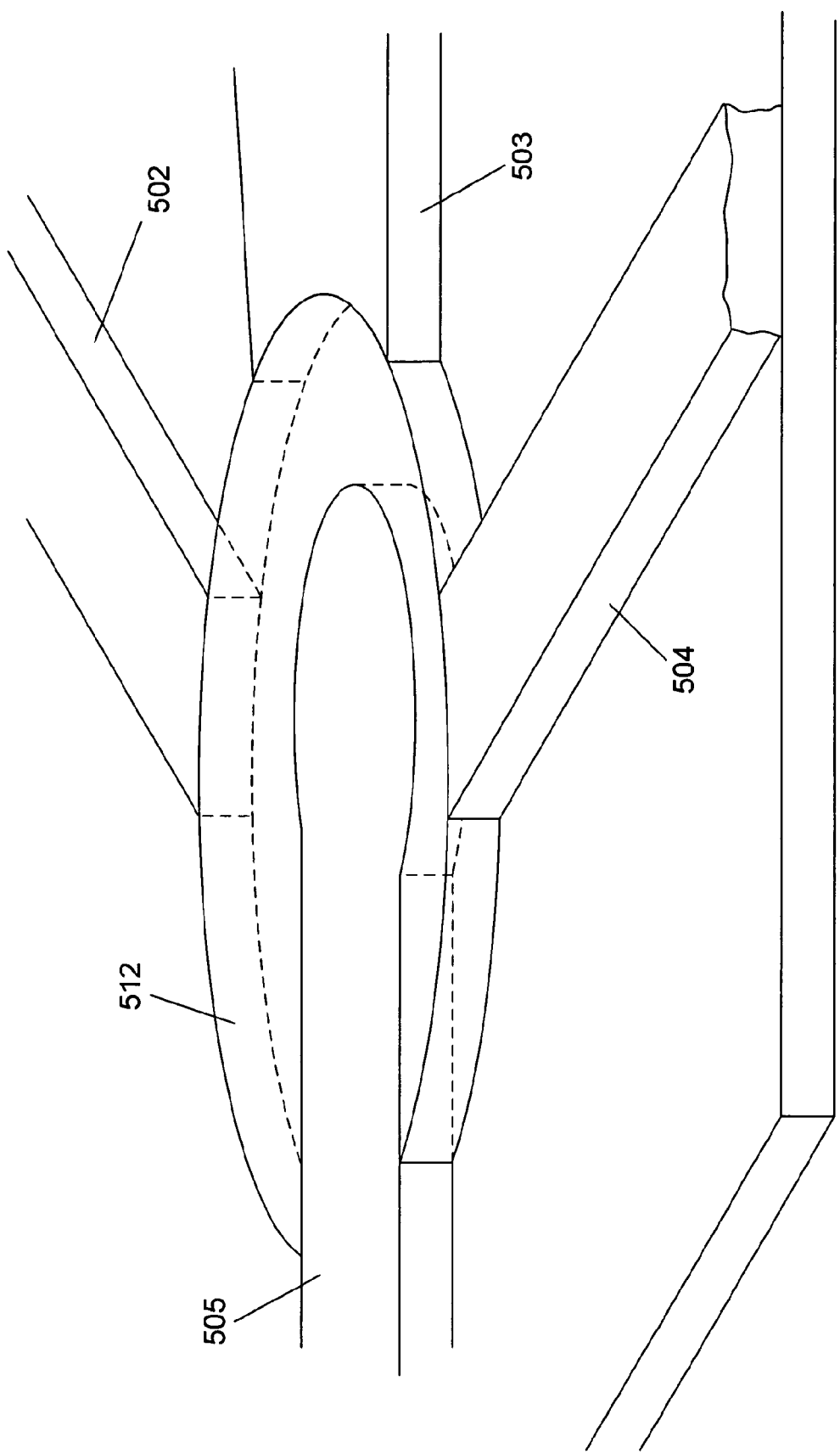
Figure 5C:
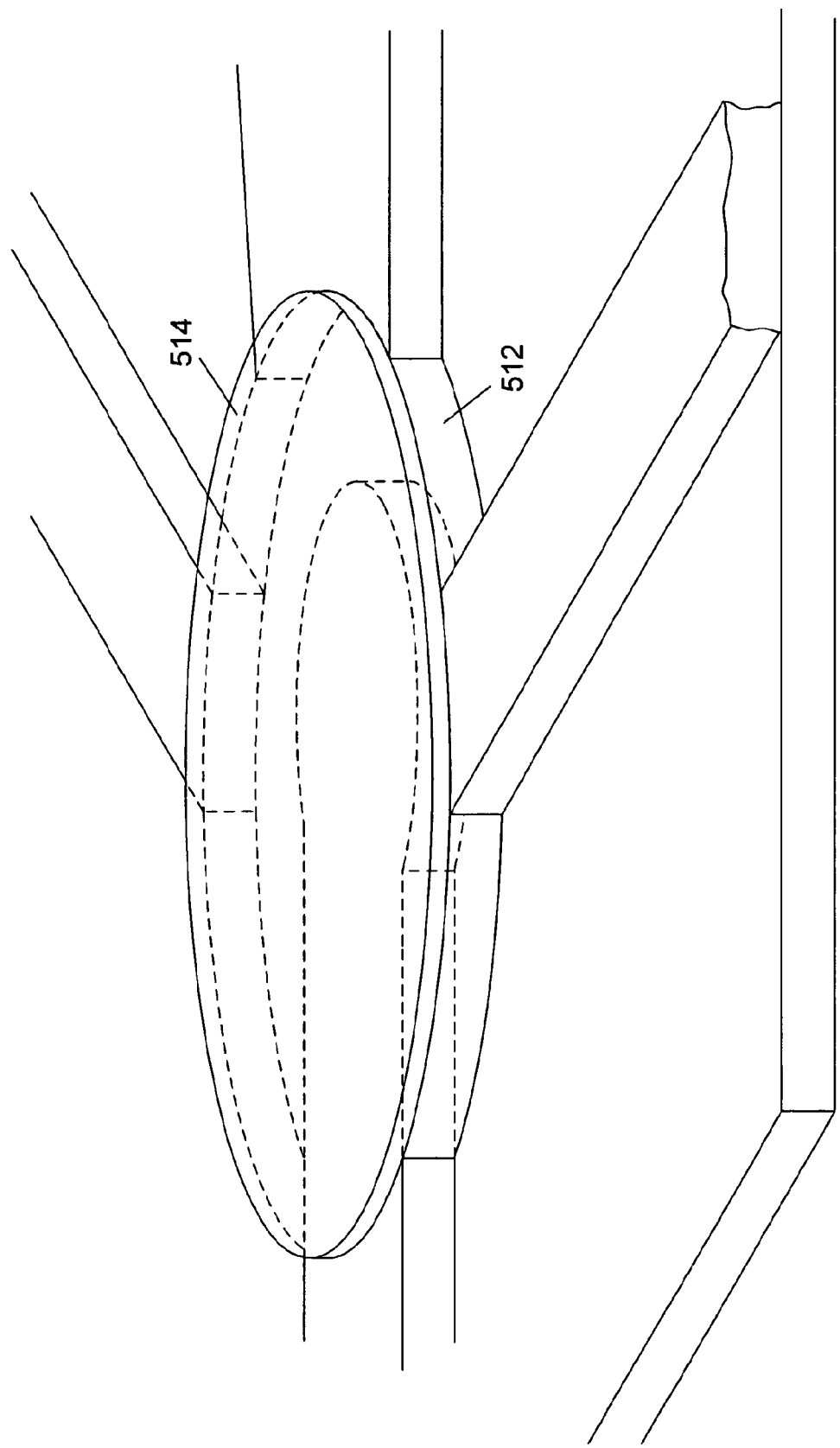
Figure 5D:
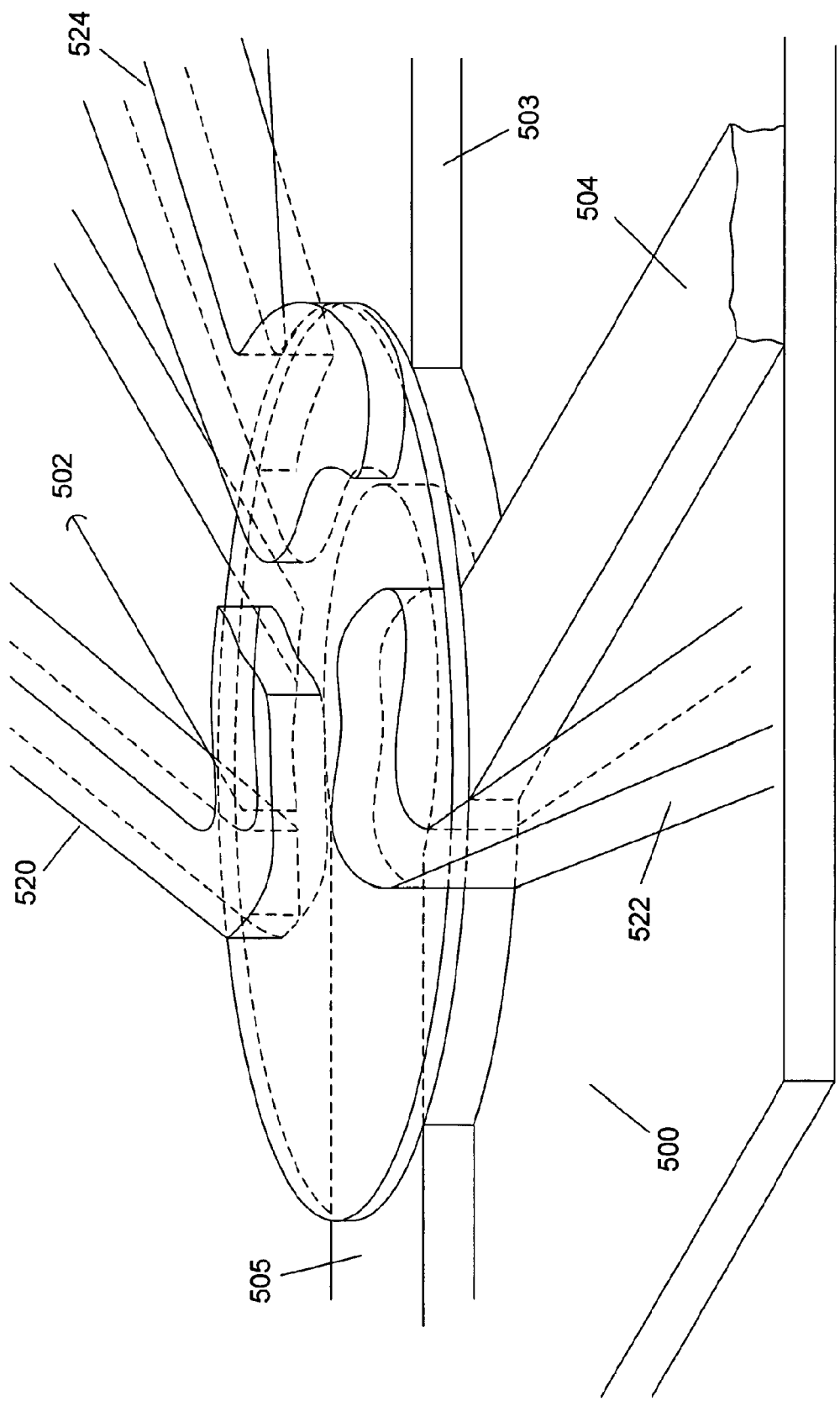

FIGS. 5A-D illustrate sequential fabrication of a multi-way, persistent, nanoscale switch according to one embodiment of the present invention. In FIG. 5A, three output signal lines 502-504 and an input signal line 505 are fabricated on the surface of a dielectric substrate 506. Note that the output signal lines 502-504 are all separated from the input signal line 505 by an annular gap 508. Thus, the output signal lines are completely decoupled from the input signal line following the initial stage of fabrication, shown in FIG. 5A. Next, as shown in FIG. 5B, a memristive material 512 is fabricated as a partial ring, or partial annulus, that fills the gap between the output signal lines 502-504 and the input signal line 505. In certain embodiments, the thickness of the memrisitive material may be greater than that of the input and output signal lines, so that a reservoir layer of, for example, $TiO_x$, does not make contact with the signal lines when the memristive material includes $TiO_x$ and $TiO_2$ layers, as discussed with reference to FIG. 4A. In an optional step, as shown in FIG. 5C, a thin insulator layer 514 may be fabricated above the memristive material 512. Next, as shown in FIG. 5D, three conductive control lines 520-522 are fabricated above the gaps between output signal lines 502-504, respectively. In this configuration, control voltages applied to the control lines 520-522 can alter the conductivity of the memristive material between the corresponding output signal line and the input signal line. For example, a $V_+$ control voltage applied to control line 520 of multi-way switch 500 produces an electric field, across the memristive material between the input signal line 505 and the output signal line 502, to change the state of the memristive material in the gap between the input signal line 505 and the output signal line 502 to a conductive state, and thus conductively couple output signal line 502 to input signal line 505. Similarly, application of a $V_-$ negative control voltage to control line 520 causes the state of the memristive material in the gap between output signal line 502 and input signal line 505 to transition back to a low-conductivity state, thus decoupling output signal line 502 from input signal line 505.

Figure 6A:
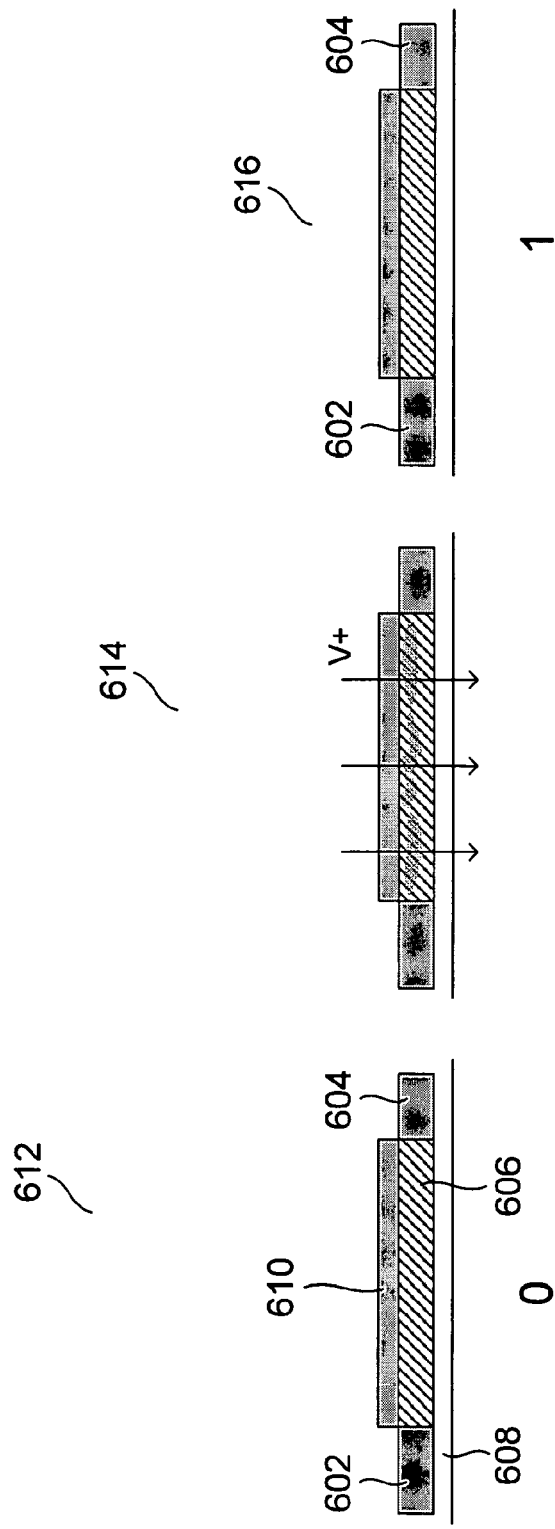
FIGS. 6A-B illustrate memristive-material state changes in the memristive-material-filled gap between an input signal line and an output signal line in a multi-way switch that represents one embodiment of the present invention.
Figure 6B:
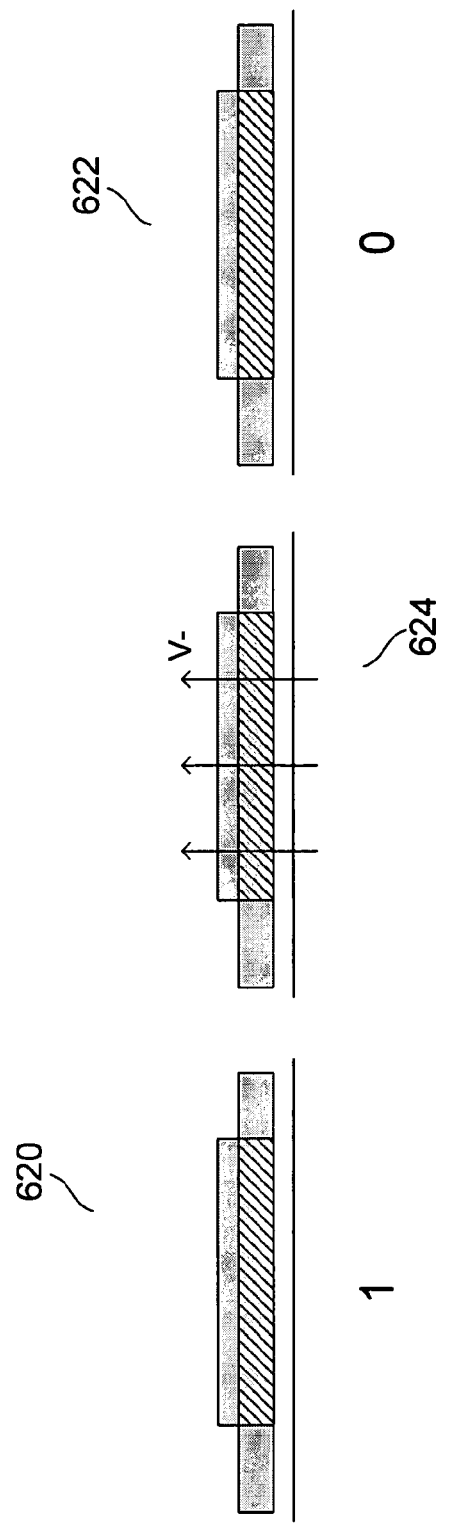

FIGS. 6A-B illustrate memristive-material state changes in the memristive-material-filled gap, or sub-switch, between an input signal line and an output signal line in a multi-way switch that represents one embodiment of the present invention. The input signal line 602, output signal line 604, memristive material 606, substrate 608, and control line 610 are shown in cross section in each of the separate diagrams of FIGS. 6A-B. When the memristive material 606 in a low-conductivity state, as shown, in FIGS. 6A-B, in crosshatch, the sub-switch that couples and decouples output signal line 604 to and from input signal line 602 is in the OFF state, represented by Boolean value "0" 612. As shown in diagram 614, application of a positive control voltage $V_+$ causes the memristive material to transition from the low-conductivity state to a conductive state. As shown in diagram 616, the high-conductivity state of the memristive material corresponds to the sub-switch being in the ON state, as represented by Boolean value "1." FIG. 6B shows a transition from the ON state, represented by Boolean value "1" 620 back to the OFF state 622 by application of a negative control voltage across the memristive material 624 via the control line.

Figure 7:
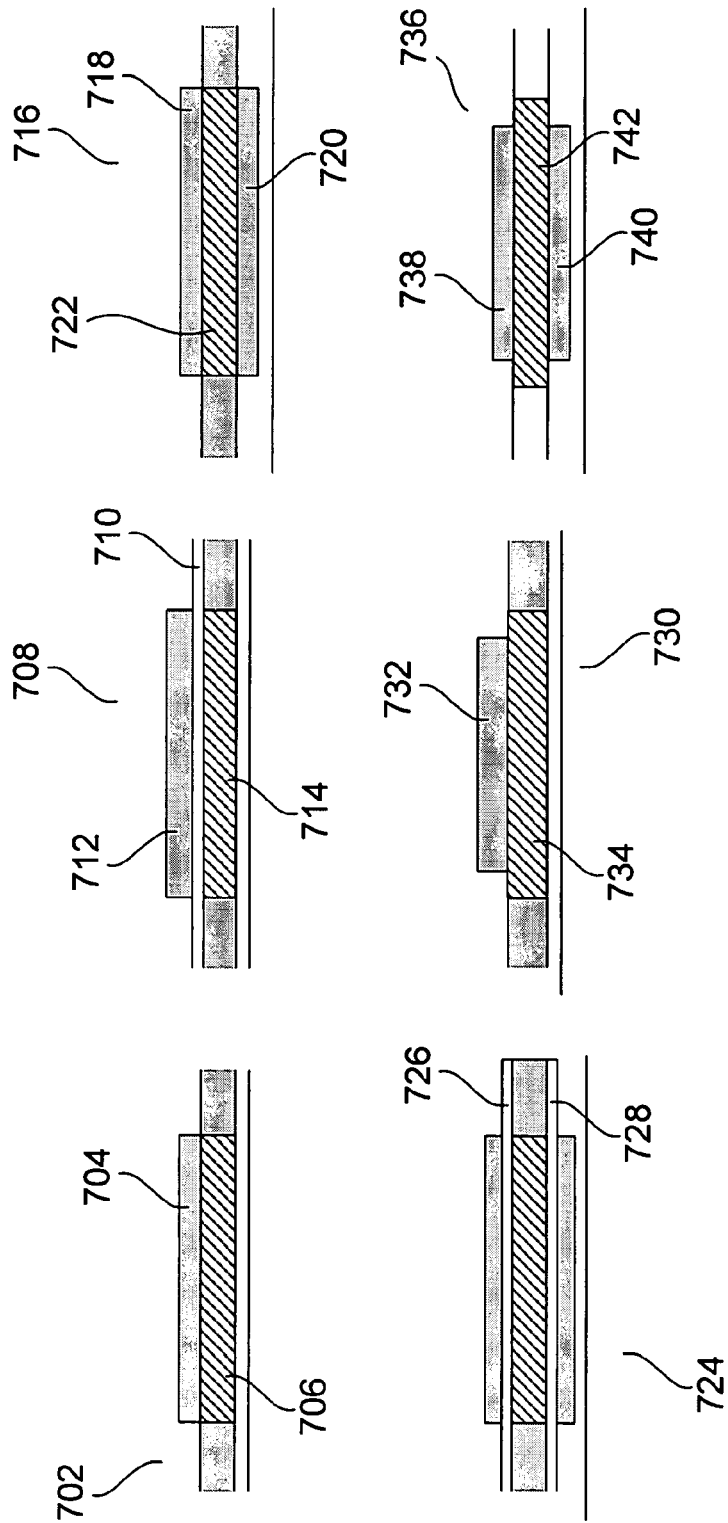
FIG. 7 illustrates a few of the many different possible configurations of a sub-switch that conductively couples and decouples an output signal line from an input signal line within various embodiments of the multi-way switch of the present invention.

FIG. 7 illustrates a few of the many different possible configurations of a sub-switch that conductively couples and decouples an output signal line from an input signal line within various embodiments of the multi-way switch of the present invention. In one embodiment 702, the control line 704 is layered directly above the memristive material 706. In an alternative embodiment 708, a thin insulating layer 710 separates the control line 712 from the memristive material 714, preventing possible transient currents in the input and output signal lines during application of control voltages to produce fields across the memristive material. In yet another embodiment 716, an upper control signal line 718 and a lower control signal line 720 sandwich the memristive material 722. In this embodiment, the field produced across the memristive element is obtained by applying a positive voltage to one of the control lines and a negative voltage to the other of the control lines, with the voltage polarities inverted to produce a field of opposite polarity. In previously discussed embodiments, the substrate may be layered above a layer that represents ground. In yet another embodiment 724, both the upper and lower control lines are separated from the memristive substance by two thin insulator layers 726 and 728. In another embodiment 730, the control line 732 does not span the entire width of the gap filled by the memristive material 734, again to prevent transient currents from flowing into the input and output signal lines during application of control voltages. In a similar embodiment 736, neither of the upper control lines 738 and the lower control lines 740 span the entire gap filled by the memristive material 742.

Figure 8:
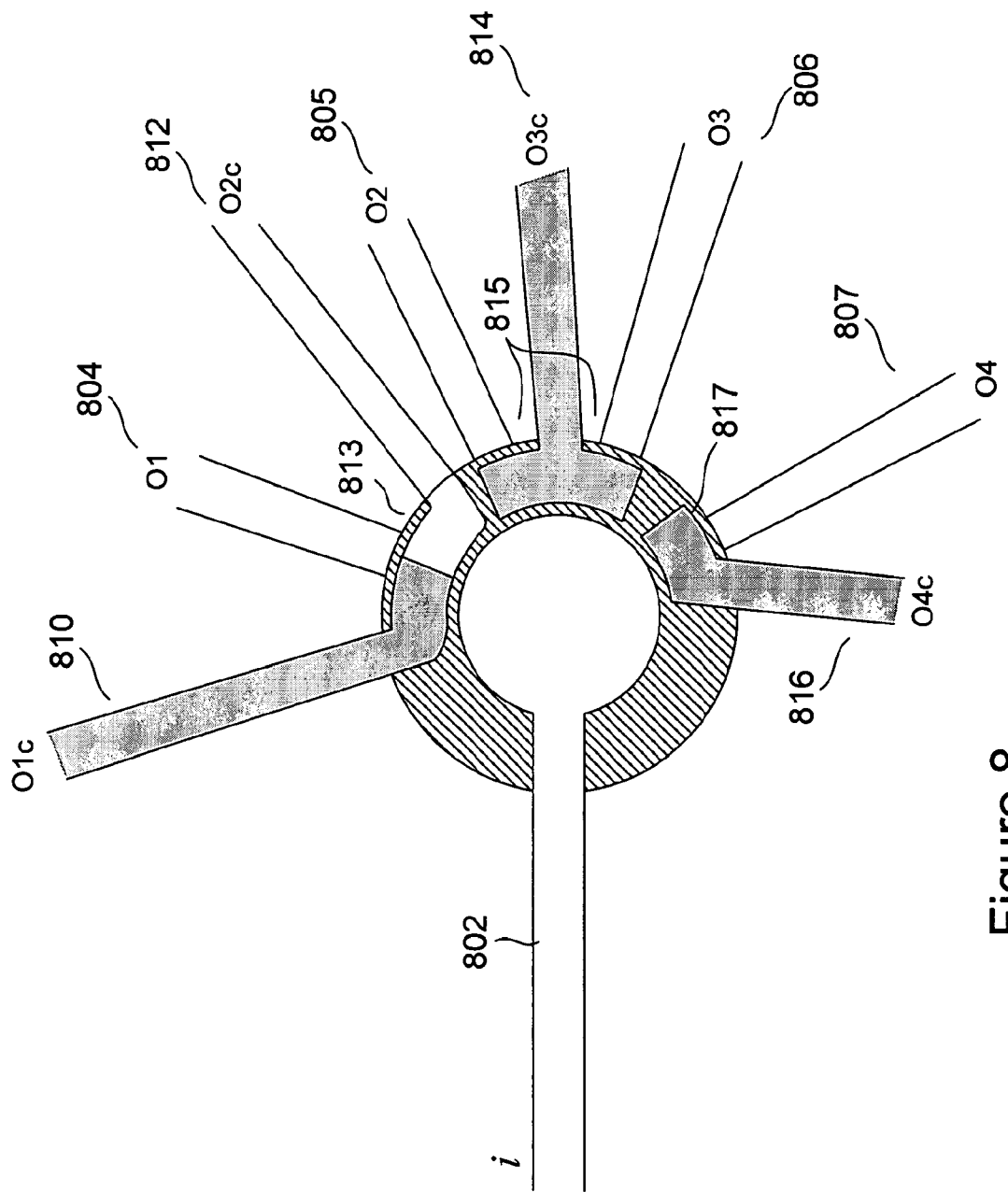
FIG. 8 provides an illustration of a multi-way switch in which off-diagonal elements of a matrix representation of the multi-way switch may change value according to embodiments of the present invention.

As discussed above, with reference to FIGS. 3A-G, multi-way-switch embodiments can be essentially arbitrarily designed to provide functionality expressible in the matrix representation of multi-way-switch functionality shown in FIGS. 3A-G. In FIGS. 3A-G, only the diagonal cells of the n×n submatrix change value, since, as discussed above, the matrix representations model the switch, shown in FIG. 2, in which each control line controls transitions between on and OFF states by a sub-switch controlling a single output signal line. FIG. 8 provides an illustration of a multi-way switch in which off-diagonal elements of a matrix representation of the multi-way switch may change value according to embodiments of the present invention. In the multi-way switch shown in FIG. 8, a single input line 802 can be reversibly conductively coupled to any of output signal lines O1 804, O2 805, O3 806, and O4 807. In this multi-way switch, the output signal line O1 804 can be reversibly connected to the input signal line 802 by either of control line O1c 810 and control line O2c 812 through sub-switch 813. Both output signal lines O2 805 and O3 806 are reversibly coupled, as a pair, by control line O3c 814 through sub-switch 815. Control line O4c 816 individually controls conductive coupling and decoupling of output signal line O4 807 with the input signal line 802 through sub-switch 817.

Figure 9:
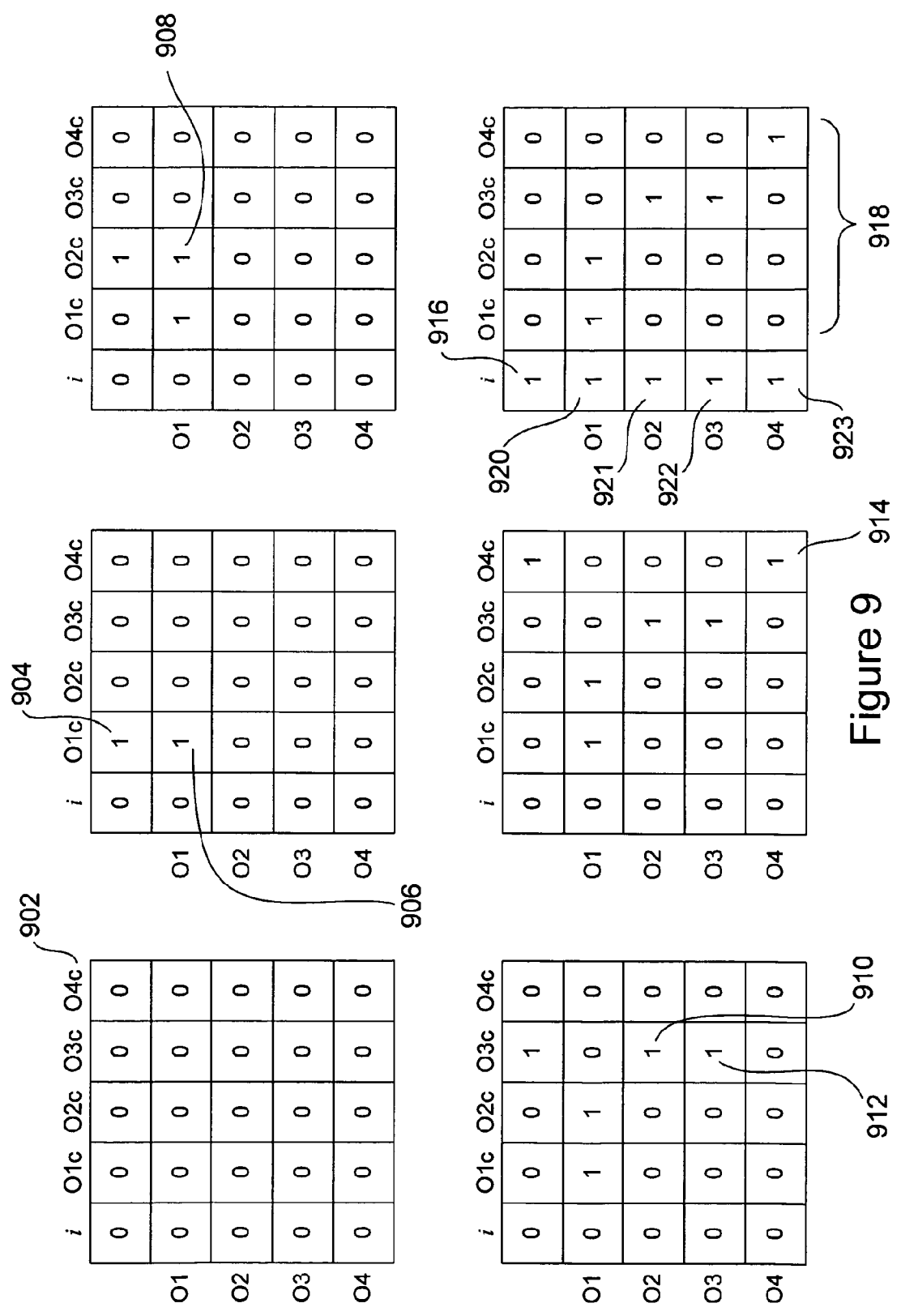

FIG. 9 provides a matrix representation of operation of the multi-way switch shown in FIG. 8. In an initial state 902, all matrix values are zero. When control signal line O1c is raised to positive control voltage, as indicated by the value "1" in cell 904, the state of the sub-switch interconnecting output line O1 804 to the input signal line 802 switches to ON, as represented by the value "1" in cell 906. Similarly, raising the control line O2c to a positive control voltage also sets the sub-switch that couples and decouples output line O1 804 to input signal line 802 to an ON state, as represented by the value "1" in cell 908. This is an example of an off-diagonal cell in the 4×4 submatrix that can change value as a result of input to a control line. Raising control line O3c 814 to a positive control voltage results in switching the sub-switch 815, which interconnect output signal lines O2 805 and O3 806 to the input signal line 802, to the ON state, as represented by the values "1" in cells 910 and 912. This is another example in which off-diagonal cells can change value. Finally, raising control line O4c 816 to a positive control voltage results in transition of the sub-switch that couples output line O4 807 to the input signal line 802 to the ON state, as represented by the value "1" in cell 914. When an input signal is input to the input signal line 802, as represented by the value "1" in cell 916, with the sub-switch states shown in the 4×4 submatrix 918, signals are output to all four output lines, as indicated by the values "1" in cells 920-923.

FIG. 10 shows a two-input, four-output multi-way switch that represents an embodiment of the present invention. In this multi-way switch 1002, a single control line 1004 controls output of signal from two input signal lines 1010-1011 to all four output signal lines 1006-1009.

Memristive-based multi-way switches that represent embodiments of the present invention are persistent, in that control voltages need be applied to control lines only for a sufficient time to change the state of a portion of the memristive material in a gap between an input line and an output line. Memristive-based, multi-way switches can thus be used in a variety of low-power circuits and devices. As discussed above, memristive-based multi-way switches provide a very wide latitude in interconnection topology and functionality. Essentially any behavior expressible in the matrix notation discussed with reference to 3A-G in FIG. 9 can be implemented in a memristive-based, multi-way switch, limited, of course, by constraints on switch size and control-line widths. More complex multi-way switches that feature multiple input lines may also be implemented according to alternative embodiments of the present invention.

Although the present invention has been described in terms of particular embodiments, it is not intended that the invention be limited to these embodiments. Modifications will be apparent to those skilled in the art. For example, as discussed above, a wide variety of different topologies and functionalities can be implemented using memristive-based multi-way switches. A variety of different memristive substances can be used in the gap between input signal lines and output signal lines. Memristive-based multi-way switches that represent embodiments of the present invention can be incorporated into an essentially limitless number of different circuits, modules, and devices. In the above-discussed embodiments, the memristive material fills a continuous gap separating the output signal lines from the input signal line, but, in alternative embodiments, the memristive material may be deposited as discrete sub-switches that interconnect one or more output signal lines with the input signal line.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended, that the scope of the invention be defined by the following claims and their equivalents.

What is claimed is:

1. A multi-way switch (200, 500) comprising:
   an input signal line (505);
   one or more output signal lines (502-504), each output signal line separated from the input signal line by a gap (508);
   a memristive material (512) within each gap between the input signal line and one of the output signal lines that forms a sub-switch; and
   one or more control lines (520-522) through which control voltages can be applied to change the conductivity states of the sub-switches to interconnect and to disconnect the input signal line (505) from the one or more output signal lines (502-504).

2. The multi-way switch of claim 1 wherein the memristive material fills a continuous gap (508) that separates the input signal line from the one or more output signal lines and wherein each sub-switch (230) is a portion of the memristive material proximal to a control line.

3. The multi-way switch of claim 1 wherein discrete depositions of memristive material form discrete sub-switches (230) that interconnect one or more output signal lines with the input signal line.

4. The multi-way switch of claim 1 wherein the input signal line, output signal line, and memristive material are fabricated within a first layer (505, 502-504, 602-604) above a substrate (506, 608) and the control lines are fabricated as a second layer (520-522, 610) above the first layer.

5. The multi-way switch of claim 4 wherein an insulator layer (710) is fabricated between the first later and the second layer.

6. The multi-way switch of claim 1 wherein control lines corresponding to the control lines in the second layer (718) and fabricated below the first layer in a third layer (720).

7. The multi-way switch of claim 6 wherein an insulator layer (728) is fabricated between the first later and the third layer.

8. The multi-way switch of claim 1 including a sub-switch (230) that interconnects the input signal line with a single output signal line.

9. The multi-way switch of claim 8 wherein the sub-switch (817, 813) is controlled by one of:
    a single control line (816); or
    two or more control lines (810, 812).

10. The multi-way switch of claim 1 including a sub-switch (815) that interconnects the input signal line with two or more output signal lines.

11. The multi-way switch of claim 10 wherein the sub-switch is controlled by one of:
    a single control line (814); or
    two or more control lines.

12. The multi-way switch of claim 1 further including one or more additional input signal lines (1011) interconnected to one or more output signal lines (502-504) by one or more memristor-based sub-switches.

13. The multi-way switch of claim 12 including a sub-switch that interconnects two or more input signal lines with a single output signal line.

14. The multi-way switch of claim 13 wherein the sub-switch is controlled by one of:
    a single control line; or
    two or more control lines.

15. The multi-way switch of claim 14 including a sub-switch that interconnects two or more input signal lines with two or more output signal lines, wherein the sub-switch is controlled by one of:
    a single control line (1004); or
    two or more control lines.

\* \* \* \* \*

UNITED STATES PATENT AND TRADEMARK OFFICE
CERTIFICATE OF CORRECTION

PATENT NO. : 8,810,074 B2  
APPLICATION NO. : 13/130797  
DATED : August 19, 2014  
INVENTOR(S) : Marco Fiorentino et al.

Page 1 of 1

It is certified that error appears in the above-identified patent and that said Letters Patent is hereby corrected as shown below:

In the Specification,

In column 3, line 2, delete "O1$e$" and insert -- 01c --, therefor.

In column 4, line 9, delete "fine" and insert -- line --, therefor.

In column 4, line 33, delete "FIG. 30" and insert -- FIG. 3G --, therefor.

In column 5, line 9, delete "FIG. 48" and insert -- FIG. 4B --, therefor.

In column 5, line 23, delete "FIG. 46" and insert -- FIG. 4B --, therefor.

In column 5, line 30, delete "memrisitive" and insert -- memristive --, therefor.

In column 5, line 40, delete "$Bc_3N_2$" and insert -- $Be_3N_2$ --, therefor.

In column 5, line 60, delete "memrisitive" and insert -- memristive --, therefor.

In column 7, line 21, delete "Roth" and insert -- Both --, therefor.

In the Claims,

In column 9, line 4, in Claim 5, delete "later" and insert -- layer --, therefor.

In column 9, line 10, in Claim 7, delete "later" and insert -- layer --, therefor.

Signed and Sealed this  
Twenty-fourth Day of February, 2015

Michelle K. Lee  
*Deputy Director of the United States Patent and Trademark Office*